(12) United States Patent
Pritsker

(10) Patent No.: US 9,998,275 B1
(45) Date of Patent: Jun. 12, 2018

(54) DIGITAL MONOBIT DITHERING CIRCUIT

(71) Applicant: Altera Corporation, San Jose, CA (US)

(72) Inventor: Dan Pritsker, San Diego, CA (US)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 14/694,785

(22) Filed: Apr. 23, 2015

Related U.S. Application Data

(60) Provisional application No. 62/118,974, filed on Feb. 20, 2015.

(51) Int. Cl.
| | |
|---|---|
| H04L 7/00 | (2006.01) |
| H04B 1/40 | (2015.01) |
| G01R 21/133 | (2006.01) |
| G01R 19/25 | (2006.01) |
| G01R 21/06 | (2006.01) |
| G01R 15/12 | (2006.01) |

(52) U.S. Cl.
CPC ............ *H04L 7/0087* (2013.01); *H04B 1/40* (2013.01); *G01R 15/125* (2013.01); *G01R 19/2509* (2013.01); *G01R 21/06* (2013.01); *G01R 21/133* (2013.01); *G01R 21/1331* (2013.01)

(58) Field of Classification Search
CPC ............ G01R 21/133; G01R 21/1331; G01R 15/125; G01R 21/06
USPC .......................................................... 324/141
See application file for complete search history.

(56) References Cited

U.S. PATENT DOCUMENTS

| | | | | |
|---|---|---|---|---|
| 5,864,592 A | * | 1/1999 | Itri | H04J 3/0676 375/220 |
| 6,980,020 B2 | * | 12/2005 | Best | H04L 25/0278 326/30 |
| 7,174,817 B1 | * | 2/2007 | Hsieh | B25B 13/461 81/472 |
| 7,176,817 B2 | * | 2/2007 | Jensen | H03M 3/332 341/118 |
| 7,224,305 B2 | * | 5/2007 | Haartsen | H03M 1/04 341/131 |
| 7,696,910 B2 | * | 4/2010 | Koyama | H03M 3/328 341/131 |
| 7,944,964 B2 | * | 5/2011 | Lee | H04L 25/0307 375/231 |
| 9,404,950 B2 | * | 8/2016 | Lafontaine | G01R 25/00 |
| 2005/0146453 A1 | * | 7/2005 | Jensen | H03M 3/332 341/131 |
| 2009/0079607 A1 | * | 3/2009 | Denison | A61B 5/04012 341/143 |
| 2011/0193549 A1 | * | 8/2011 | Yao | G01R 15/125 324/123 R |
| 2012/0275199 A1 | * | 11/2012 | Li | H02M 3/33507 363/21.15 |

(Continued)

OTHER PUBLICATIONS

Liu, Hao, et al. "Development of a three-element interferometer at 50~ 56 GHz for Geostationary Interferometric Microwave Sounder (GIMS)." Geoscience and Remote Sensing Symposium (IGARSS), 2010 IEEE International. IEEE, 2010.*

*Primary Examiner* — Jermele M Hollington
*Assistant Examiner* — Christopher McAndrew
(74) *Attorney, Agent, or Firm* — Fletcher Yoder, P.C.

(57) ABSTRACT

Techniques and mechanisms disclosed herein add dithering noise to a receiver to reduce harmonics.

13 Claims, 10 Drawing Sheets

(56) References Cited

U.S. PATENT DOCUMENTS

2015/0130483 A1* 5/2015 Yao .................... H03F 3/45475
324/705

* cited by examiner

DIGITAL MONOBIT DITHERING CIRCUIT

PRIORITY DATA

This patent document claims priority to commonly assigned U.S. Provisional Patent Application No. 62/118,974, titled "Digital Monobit Dithering Using Receivers and Transmitters of Transceivers", by Pritsker, filed on Feb. 20, 2015, which is hereby incorporated by reference in its entirety and for all purposes.

TECHNICAL FIELD

This disclosure generally relates to a circuit for digital monobit dithering.

DESCRIPTION OF THE RELATED TECHNOLOGY

Serial transceivers provide communications between different devices. For example, parallel data may be received by a transceiver on a device and converted into serial data (e.g., with a transmitter of the transceiver) for high-speed transmission over a cable or a printed circuit board (PCB) trace to another device with another transceiver that receives the serialized data and converts it back into parallel data (e.g., with a receiver of the other transceiver). Multiple transceivers on a device also may provide data to multiple transceivers on another device to create transceiver-transceiver pairs for transmitting and receiving data in a high-speed serial interface.

Ultra-wideband receivers and transmitters may be used in electronic warfare, communications, electronic intelligence, and other applications where a wide span of the radio frequency (RF) spectrum may be monitored. Receivers of transceivers can be used to perform monobit sampling (i.e., 1-bit sampling) of data in these applications. However, if the output providing the sampled data is analyzed with a spectrum analysis, undesired "spurs" representing undesired harmonics may be generated due to various effects from the sampling process. A designer may wish to remove or reduce the spurs.

SUMMARY

The subject matter described herein provides a sampling circuit with monobit dithering.

In some scenarios, a circuit (e.g., a receiver) may receive a data signal to sample and provide the sampled data signal at an output. However, if the sampled data signal is analyzed under a spectrum analysis, undesired harmonics may be observed. In one implementation described herein, dithering noise may be added to a reference voltage applied to an input of the circuit and used to compare with another input associated with the data signal to reduce the harmonics. In an implementation, another circuit (e.g., a transmitter) can generate the dithering noise used by the circuit performing the sampling (e.g., a receiver).

These and other features will be presented in more detail in the following specification and the accompanying figures, which illustrate by way of example.

DETAILED DESCRIPTION OF PARTICULAR EMBODIMENTS

Ultra-wideband receivers and transmitters of transceivers may be used in electronic warfare, communications, electronic intelligence, and other applications where a wide span of the radio frequency (RF) spectrum may be monitored. Receivers of transceivers can be used to perform monobit sampling (i.e., 1-bit sampling) of data in these and other applications.

Figure 1:
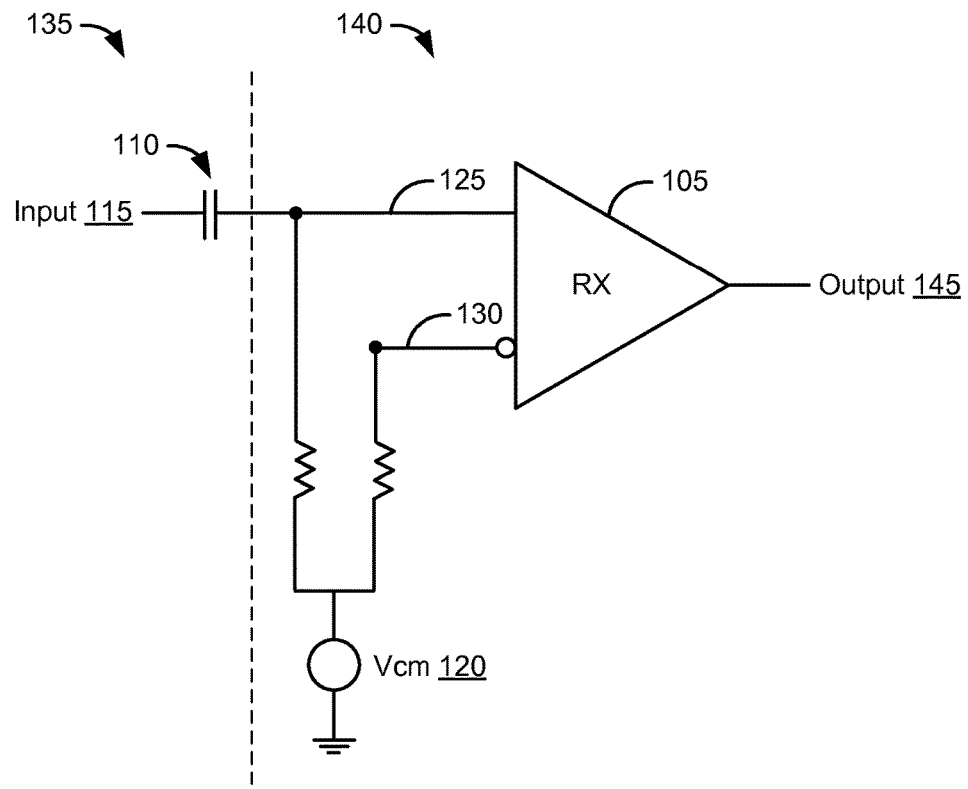
FIG. 1 illustrates an example of a receiver for monobit sampling.

FIG. 1 illustrates an example of a receiver for monobit sampling. In FIG. 1, receiver 105 may be implemented as part of a transceiver that also includes a transmitter. Transceivers are circuits that provide communications between different devices. For example, data may be transmitted by a transmitter of a transceiver on one device and provided to a receiver of another transceiver on another device.

In FIG. 1, receiver 105 may be implemented in chip 140, which may be an application specific integrated circuit (ASIC), field programmable gate array (FPGA), complex programmable logic device (CPLD), structured ASIC, or other type of semiconductor device. PCB 135 may be a printed circuit board with a Direct Current (DC) separating capacitor 110 and a trace, or interconnect, providing input 115 as data to receiver 105.

Receiver 105 may perform monobit sampling of input 115 (providing a data signal) and provide the sampled output on output 145 (providing sampled data of the data signal) by comparing the voltages on its inputs. Receiver 105 includes two inputs, depicted as differential pair inputs in FIG. 1. One input may receive data to be compared with a reference voltage applied to the second input to provide the sampled output.

In particular, when the voltage on differential pair input 125 is higher than the voltage on differential pair input 130, receiver 105 may generate a "1" (i.e., a high bit) on output 145. When the voltage on differential pair input 125 is lower than the voltage on differential pair input 130, receiver may generate a "0" (i.e., a low bit) on output 145. Accordingly, receiver 105 may implement an ultra-wideband analog-to-digital (ADC) converter providing monobit sampling.

For example, in FIG. 1, both differential pair inputs 125 and 130 are de-coupled from input 115 to receive a DC voltage from reference voltage source Vcm 120. Input 115 is alternating current (AC) coupled with input 115 by capacitor 110 in PCB 135 such that the direct current (DC) component of input 115 is filtered out and the AC component is provided to differential pair input 125 of receiver 105. As a result, the voltage on differential pair input 125 may oscillate around the DC voltage (i.e., it is offset by the DC voltage) provided by reference voltage source Vcm 120. Differential pair input 130 may be at the DC voltage provided by reference voltage source Vcm 120.

Figure 2:
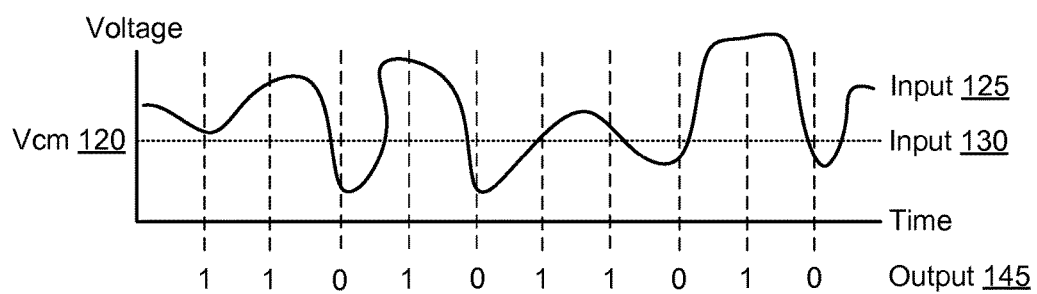
FIG. 2 illustrates an example of monobit sampling.

As previously discussed, receiver 105 may perform monobit sampling of input 115 and provide the sampled output on output 145 by comparing the voltages on differential pair inputs 125 and 130. In particular, the voltage on differential pair input 125 that is biased by reference voltage source Vcm 120 and AC coupled with input 115 may be compared with the voltage on differential input pair 130 that is biased by reference voltage source Vcm. FIG. 2 illustrates an example of monobit sampling.

In FIG. 2, differential pair input 130 is at voltage Vcm (as provided by reference voltage source Vcm 120), as indicated by the horizontal dotted line. Since differential pair input 125 is AC coupled with input 115 in FIG. 1, the voltage on differential pair input 125 oscillates around the voltage Vcm in FIG. 2. When the voltage on differential pair input 125 is higher than the voltage on differential pair input 130 during sampling times (as indicated by the vertical dotted lines in FIG. 2), output 145 may provide a 1. Otherwise, when the voltage on differential pair input 130 is higher than the voltage on differential pair input 125, output 145 may provide a 0. For example, in FIG. 2, ten monobit samplings are performed. In the first sampling, the voltage on differential pair input 125 (i.e., the voltage that is the result of AC coupling input 115 with the DC voltage provided by reference voltage source Vcm 120) is higher than the voltage on differential pair input 130 (i.e., the DC voltage provided by reference voltage source Vcm 120), and therefore, a 1 is provided by receiver 105 on output 145. By contrast, in the third sampling, the voltage on differential pair input 125 is lower than the voltage on differential pair input 130, resulting in receiver 105 providing a 0 on output 145. As a result, the analog input 115 is sampled to provide digital output 145.

Figure 3:
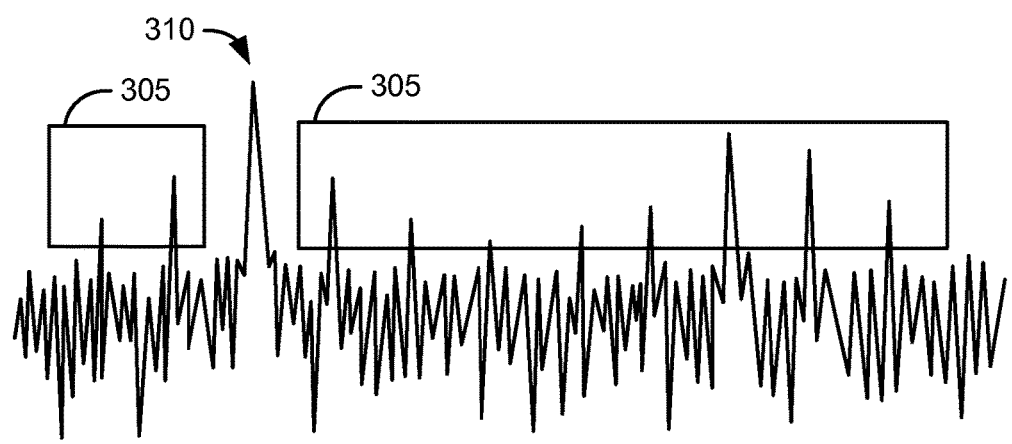
FIG. 3 illustrates a simplified example of a spectrum analysis of a sampled output from a monobit sampler.

FIG. 3 illustrates a simplified example of a spectrum analysis of a sampled output. For example, FIG. 3 may be a spectrum analysis of output 145. In FIG. 3, spurs 305 may represent undesired harmonics that may be generated due to various effects from the sampling process (e.g., analog distortions, sample-and-hold circuitry issues, correlation of the sampling rate or clock to the input may cause concentrated spurious energy at particular bands, etc.). Spur 310 in FIG. 3 may be expected as it exists due to input 115 (e.g., if input 115 is a sinusoidal 3 gigahertz (GHz) signal then the corresponding spur 310 associated with a 3 GHz signal is seen in the spectrum analysis).

Often, the harmonics (represented by spurs 305) should be reduced. One technique to reduce the harmonics is to implement dithering. Dithering mixes in random noise to reduce the harmonics, and therefore, reducing spurs 305.

Figure 4:
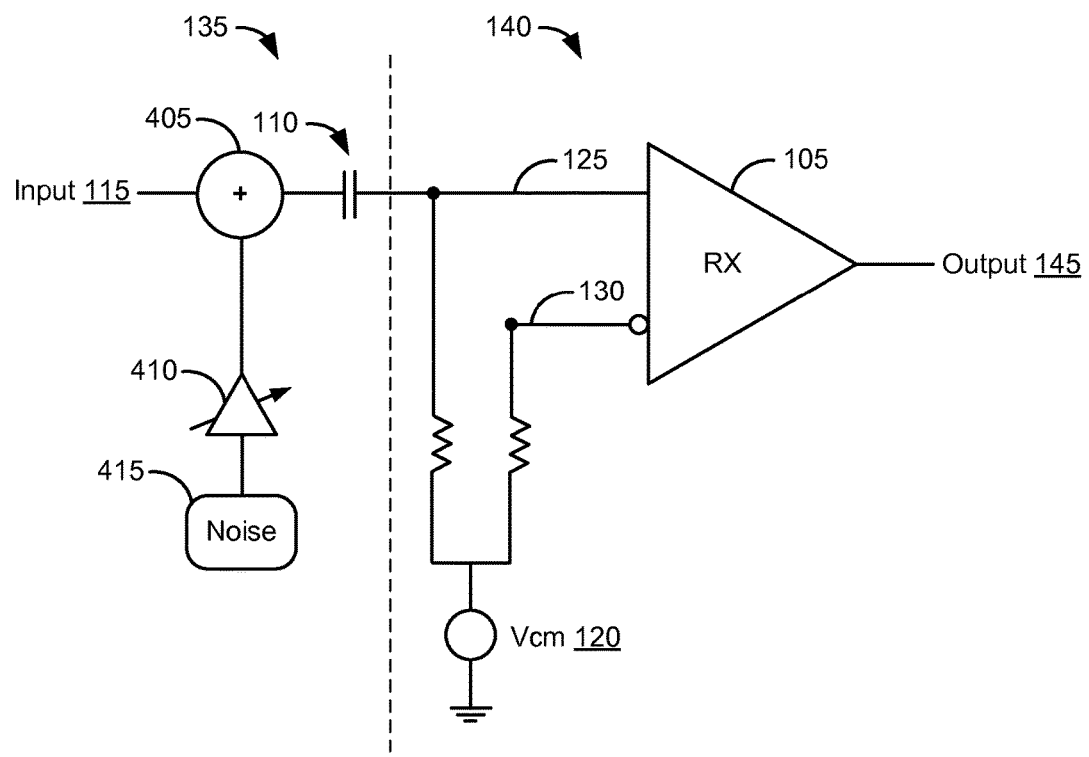
FIG. 4 illustrates an example of analog dithering.

FIG. 4 illustrates an example of analog dithering. In the analog dithering of FIG. 4, dithering noise is added to input 115 (i.e., the data to be provided to receiver 105) to reduce spurs 305 in FIG. 3. For example, in FIG. 4, noise generator 415, amplifier 410, and radio frequency (RF) combiner 405 may be discrete RF components implemented in PCB 135. Noise generator 415 may generate noise, amplifier 410 may amplify the noise, and RF combiner 405 may add the amplified noise to input 115. The resulting input 115 with the amplified noise is then AC coupled with differential pair input 125 by capacitor 110. Accordingly, the dithering noise is added to input 115 and then AC coupled to differential pair input 125. The voltages on differential pair inputs 125 and 130 may then be compared by receiver 105 to determine the output on output 145.

Figure 5:
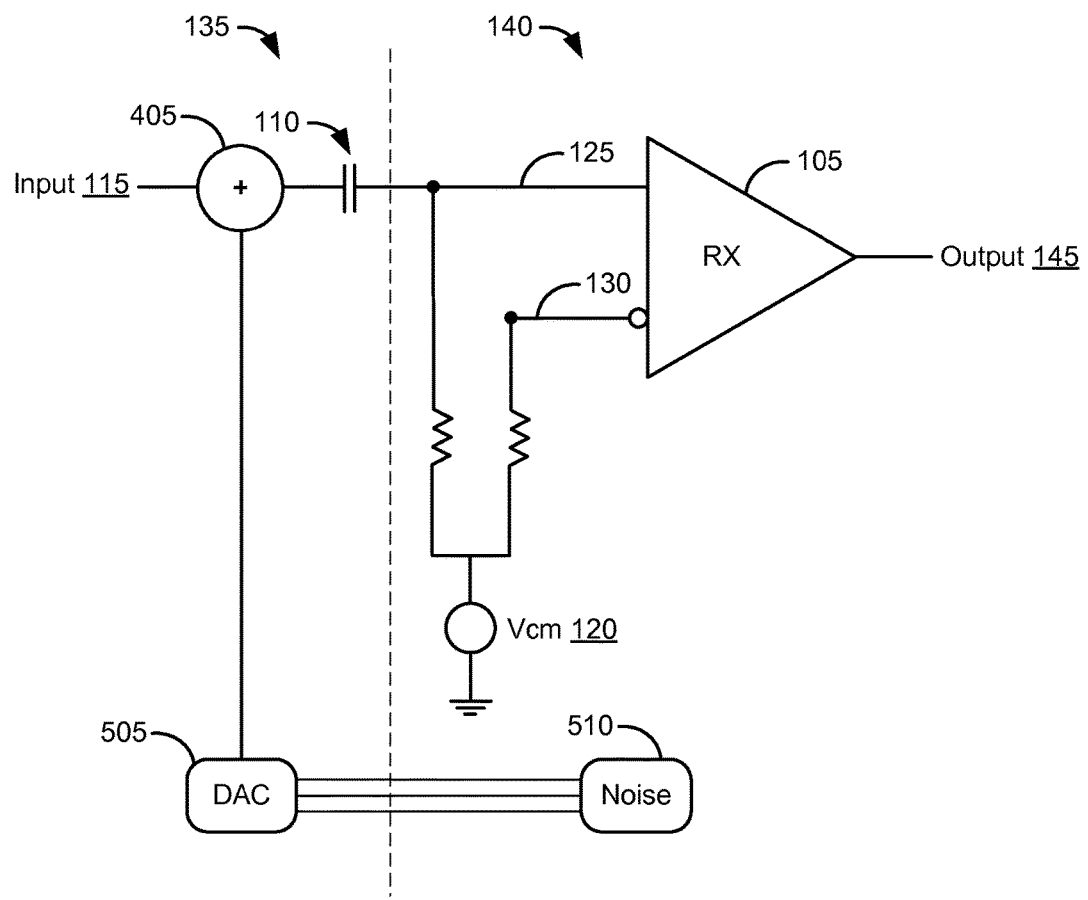
FIG. 5 illustrates an example of digital dithering.

FIG. 5 illustrates an example of digital dithering. In the digital dithering of FIG. 5, dithering noise is also added to input 115. For example, in FIG. 5, noise generator 510 may be a noise source (e.g., a random bit stream generator, pseudo-random bit stream generator, or other type of random or pseudo-random data source that can generate bits) to generate noise and provide the noise to digital-to-analog converter (DAC) 505. DAC 505 converts the digital noise data provided by noise generator 510 to an analog output and provides the analog output to RF combiner 405, which may then add the noise to input 115. The resulting input 115 with the dithering noise is then AC coupled with differential pair input 125 by capacitor 110. Accordingly, the dithering noise is also added to input 115 (i.e., the data to be provided to receiver 105) and AC coupled with differential pair input 125.

Figure 6:
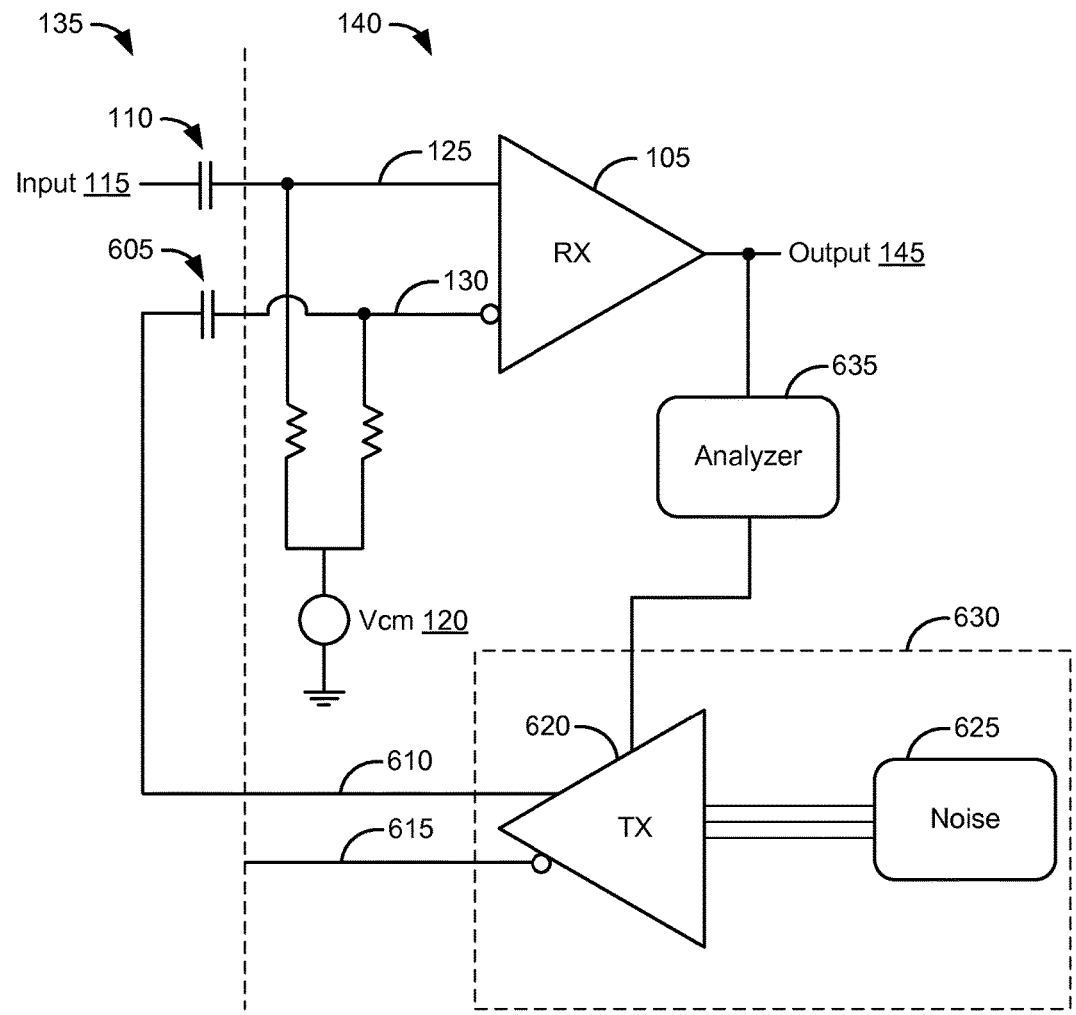
FIG. 6 illustrates an example of dithering with noise on a reference voltage in accordance with some implementations.

FIG. 6 illustrates an example of dithering with noise on a reference voltage in accordance with some implementations. The dithering noise is generated directly from chip 140 (e.g., an FPGA, ASIC, or other type of semiconductor device, as previously discussed) using a transmitter channel of the transceiver that is integrated in chip 140. The implementation of FIG. 6 may eliminate the need to incorporate explicit digital to analog conversion using external components or devices. In addition, by contrast to the applications of FIGS. 4 and 5, the dithering noise in FIG. 6 is added to the reference voltage at differential pair input 130 rather than input 115 (i.e., the data). By adding dithering noise to the reference voltage input (i.e., differential pair input 130) that is used to compare with the voltage on the input corresponding to the data (i.e., differential pair input 125), the input corresponding with the reference voltage may also have an oscillating voltage and the sampling process may generate different sampled data on output 145, which may reduce spurs 305 in FIG. 3. Moreover, the implementation of FIG. 6 uses fewer components, reduces the cost of implementing dithering, and lowers power requirements compared to the applications of FIGS. 4 and 5.

In FIG. 6, both differential pair inputs 125 and 130 are also coupled to receive a DC voltage from reference voltage source Vcm 120. Input 115 is also AC coupled with input 115 by capacitor 110 in PCB 135 such that the DC component of input 115 is filtered out and the AC component is provided to differential pair input 125 of receiver 105. As a result, the voltage on differential pair input 125 may oscillate around the voltage provided by reference voltage source Vcm 120 (i.e., the AC component of the data signal on input 115 is offset by the voltage provided by reference voltage source Vcm 120).

However, differential pair input 130 is also AC coupled with output 610 from transmitter 620 of noise source 630 to also have the voltage on differential pair input 130 oscillate around the voltage provided by reference voltage source Vcm 120 (i.e., the voltage on output 610 is also offset by the voltage provided by reference voltage source Vcm 120). That is, the reference voltage at both differential pair inputs 125 and 130 may be adjusted by AC coupled signals. The reference voltage at differential pair input 125 may be adjusted by AC coupling input 115 (i.e., the data signal). The reference voltage at differential pair input 130 may be adjusted by AC coupling output 610 (i.e., the noise signal).

For example, in FIG. 6, noise source 630 may generate dithering noise on output 610, which is AC coupled with capacitor 605 to differential pair input 130 such that the DC component of output 610 is blocked and the AC component of the voltage on output 610 is added to the voltage on differential pair input 130 provided by reference voltage source Vcm 120. In particular, noise source 630 in FIG. 6 includes transmitter 620 and bit generator 625 (e.g., a random, pseudorandom, etc. bit generator). Bit generator 625 may generate bits for transmitter 620 to receive and provide at output 610 to be AC coupled onto differential pair input 130. In effect, this may add noise to the reference voltage at the negative input of the differential input pair (i.e., differential pair input 130) of receiver 105, which is used to compare with the voltage at the other input, corresponding with the data, of receiver 105 to generate the sampled data on output 145, as previously discussed.

Figure 7:
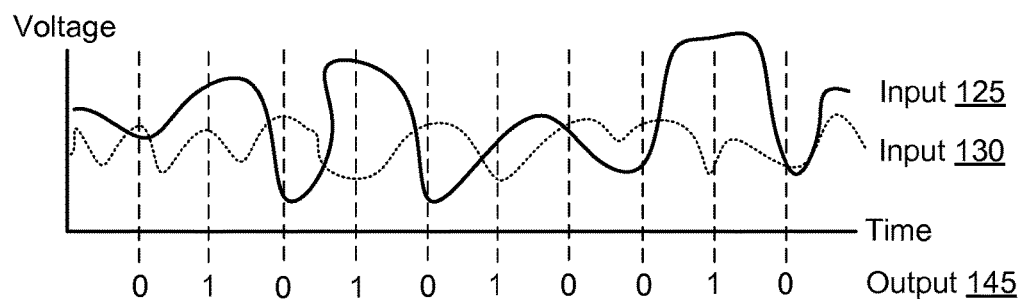
FIG. 7 illustrates an example of a monobit sampling with the dithering provided by the circuit of FIG. 6.

FIG. 7 illustrates an example of monobit sampling with the dithering provided by the circuit of FIG. 6. In FIG. 7, the voltage of differential pair input 130 oscillates around the voltage provided by reference voltage source Vcm 120, as indicated by the oscillating dotted line, due to differential pair input 130 being AC coupled with output 610. The voltage on differential pair input 125 also oscillates around the voltage provided by reference voltage source Vcm 120, similar to the example of FIG. 2. Similarly, when the voltage on differential pair input 125 is higher than the voltage on differential pair input 130 during a sampling time (as indicated by the vertical dotted lines in FIG. 7), output 145 may provide a 1. Otherwise, when the voltage on differential pair input 130 is higher than the voltage on differential pair input 125, output 145 may provide a 0.

Figure 8:
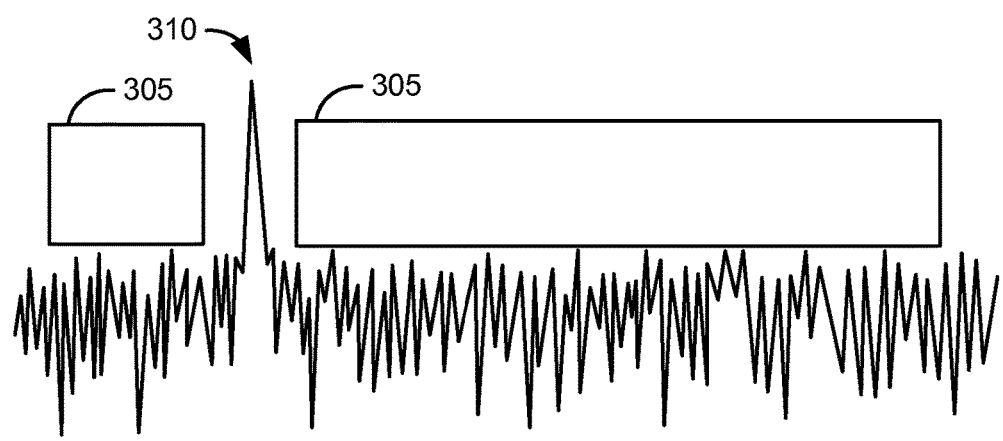
FIG. 8 illustrates a simplified example of a spectrum analysis of the sampled output of FIG. 6 and FIG. 7.

However, with the voltage on differential pair input 130 oscillating (by contrast to differential pair input 130 being at Vcm in FIG. 2), the data provided by receiver 105 on output 145 may be different. For example, FIGS. 2 and 7 show the same voltage on differential pair input 125, but with different voltages on differential pair input 130. Since the voltage on differential pair input 130 is oscillating in FIG. 7, output 145 in FIG. 7 differs from output 145 in FIG. 2. For example, in FIG. 7, the first and seventh samplings provided at output 145 are at different values than in FIG. 2. The different values provided by receiver 105 in FIG. 6 may reduce the spurs that would otherwise be visible in the spectrum analysis of FIG. 3. FIG. 8 illustrates a simplified example of a spectrum analysis of the sampled output of FIG. 6 and FIG. 7. By contrast to FIG. 3, FIG. 8 does not include spurs 305 due to the added noise at differential pair input 130 (i.e., noise added to the reference voltage provided by voltage reference source Vcm 120).

In some implementations, the reference voltages provided at differential pair inputs 125 and 130 may be different. For example, reference voltage source Vcm 120 may be provided to differential pair input 125 to provide a first voltage, but a second reference voltage may be provided to differential pair input 130. Another reference voltage source may be used to generate the second reference voltage, or the same reference voltage source Vcm 120 may be used (e.g., by using voltage dividers or other circuitry to provide the desired second reference voltage). Having a different second reference voltage may further offset the voltage at differential pair 130 to further affect the values of output 145.

As previously discussed, transceivers may include transmitters for transmitting data and receivers for receiving data. In FIG. 6, receiver 105 and transmitter 620 may be components of the same transceiver. For example, both receiver 105 and transmitter 620 may be part of a transceiver I/O circuitry of a single pin or bonding pad of chip 140. However, in other implementations, receiver 105 and transmitter 620 may be components of different transceivers. For example, receiver 105 may be part of a transceiver of one I/O circuit and associated with one pin, while transmitter 620 may be part of another transceiver I/O circuit associated with another pin.

In some implementations, output 610 provided by transmitter 620 may be used to add noise to differential pair inputs 130 of multiple receivers 105. For example, transmitter 620 may provide dithering noise to the reference voltages at an input of receiver 105 in FIG. 6 as well as another receiver. In some implementations, output 610 may be within chip 140 in FIG. 6. For example, each transmitter and receiver of a transceiver may include an internal connection between the two within the same chip.

In some implementations, transmitter 620 provides a differential output with outputs 610 and 615. In FIG. 7, output 615 is not used. However, output 615 may be used to add noise to a reference voltage of another receiver 105. In some implementations, output 615 rather than output 610 may be used to provide dithering noise to differential pair input 130.

Transmitter 620 may include a physical medium attachment (PMA) that governs a variety of settings, including the voltage swing of transmitter 620. The voltage swing of transmitter 620 may be the differential voltage between outputs 610 and 615. For example, a 100 mV differential voltage may correspond with a voltage swing of −50 mV to 50 mV. That is, when the voltage on output 610 is 50 millivolts (mV), then the voltage on output 615 is −50 mV. When the voltage on output 610 is −50 mV, then the voltage on output 615 is 50 mV.

The voltage swing of transmitter 620 may be adjusted to control the amount of noise to be provided at differential pair input 130. For example, the voltage swing of transmitter 620 may be increased to reduce the unwanted harmonics (i.e., spurs 305) to a desired level. In particular, increasing the voltage swing may increase the amount of noise (e.g., increase the magnitude of the noise signal on output 610) AC coupled with the reference voltage at differential pair input 130 and further reduce the harmonics. In some implementations, the sampled data on output 145 may be analyzed externally from chip 140 (e.g., with the MATLAB® software program on a computer to perform a spectrum analysis), and a designer may configure transmitter 620 to have a particular voltage swing.

In some implementations, additional spectrum analysis logic 635 may be implemented within chip 140 that can analyze the sampled data on output 145, determine that spurs 305 are above a threshold level, and then adjust the voltage swing of transmitter 620. Spectrum analysis logic 635 may continuously monitor output 145 and keep adjusting the voltage swing (e.g., increasing the voltage swing) until spurs 305 have reduced to below the threshold level. If spurs 305 again go above the threshold level, then spectrum analysis logic 635 may then adjust the voltage swing of transmitter 620 again to reduce spurs 305 back below the threshold level.

In some implementations, bit generator 625 may provide parallel data to transmitter 620 and transmitter 620 may serialize the parallel data. In some implementations, bit generator 625 may be integrated within transmitter 620 or may be part of the transceiver that transmitter 620 is a component of. In some implementations, bit generator 625 may be implemented within logic outside of the I/O circuitry including the transceivers. For example, if implemented in an FPGA, bit generator 625 may be implemented within the configurable logic. Bit generator 625 also may be fixed circuitry. In some implementations, bit generator 625 may be implemented within another chip other than chip 140.

Using transmitter 610 may provide a high data rate, and therefore, the generated dithering noise on output 610 may be able to have a wide band that may be suitable for electronic warfare, communications, and electronic intelligence applications. Though the implementation of FIG. 6 uses a transmitter, other implementations may use other components that can provide noise on output 610. For example, other type of circuitry that can provide a noise source that can be AC coupled to modulate the reference voltage at an input of receiver 105 may be used.

The preceding examples also illustrate embodiments implementing digital monobit dithering using a receiver of a transceiver. However, the techniques and methodologies disclosed herein also may be used in other types of circuits other than receivers of transceivers. For example, another type of circuit that can compare voltages on inputs, with one input receiving input 115 and another input receiving output 610, and provide the corresponding sampled data on output 145.

In some implementations, the components of PCB 135 and chip 140 may be integrated together. For example, all of the components of PCB 135 and chip 140 may be components on a PCB. In another example, all of the components of PCB 135 and chip 140 may be implemented in the same chip. In some implementations, the distribution of components between chip 140 and PCB 135 may vary from the examples disclosed herein. For example, capacitor 110 may be a component of chip 140 and reference voltage source Vcm 120 may be a component on PCB 135.

In FIG. 6, input 115 is provided to the positive input of the differential input pair of receiver 105. However, in other implementations, input 115 can be provided to the negative input of the differential input pair of receiver 105 and the dithering noise on output 610 may be provided to the positive input of the differential input pair. Moreover, in FIG. 6, noise generator 625 is a digital noise source. However, in other implementations, an analog noise source may be used.

Figure 9A:
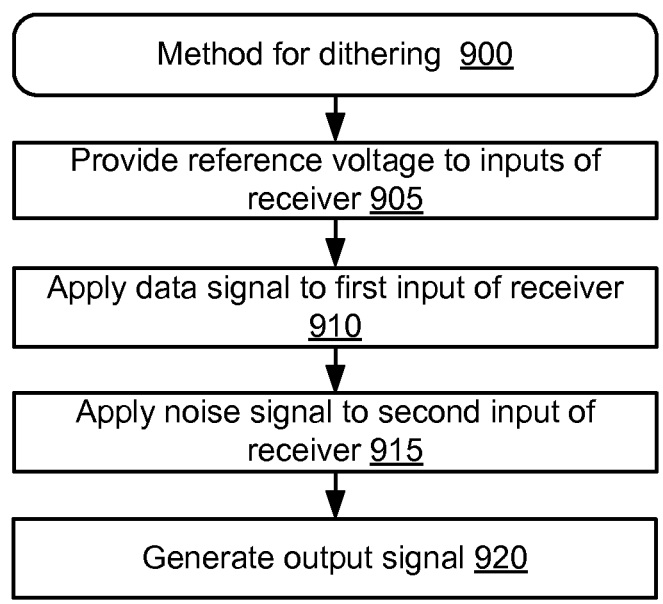
FIG. 9A is a flowchart illustrating a process flow for dithering by adding noise on a reference voltage in accordance with some implementations.

FIG. 9A is a flowchart illustrating a process flow for dithering by adding noise on a reference voltage in accordance with some implementations. In FIG. 9A, at block 905, a reference voltage may be provided to inputs of a receiver. For example, two inputs of a receiver may be provided a DC reference voltage from a reference voltage source. At block 910, a data signal may be applied to the first input of the receiver. For example, the data signal may be AC coupled with the DC reference voltage at the first input of the receiver. At block 915, a noise signal may be applied to second input of the receiver. For example, the noise signal may be AC coupled with the DC reference voltage at the second input of the receiver. At block 920, the receiver may generate an output signal based on a comparison of the first voltage and the second voltage.

Figure 9B:
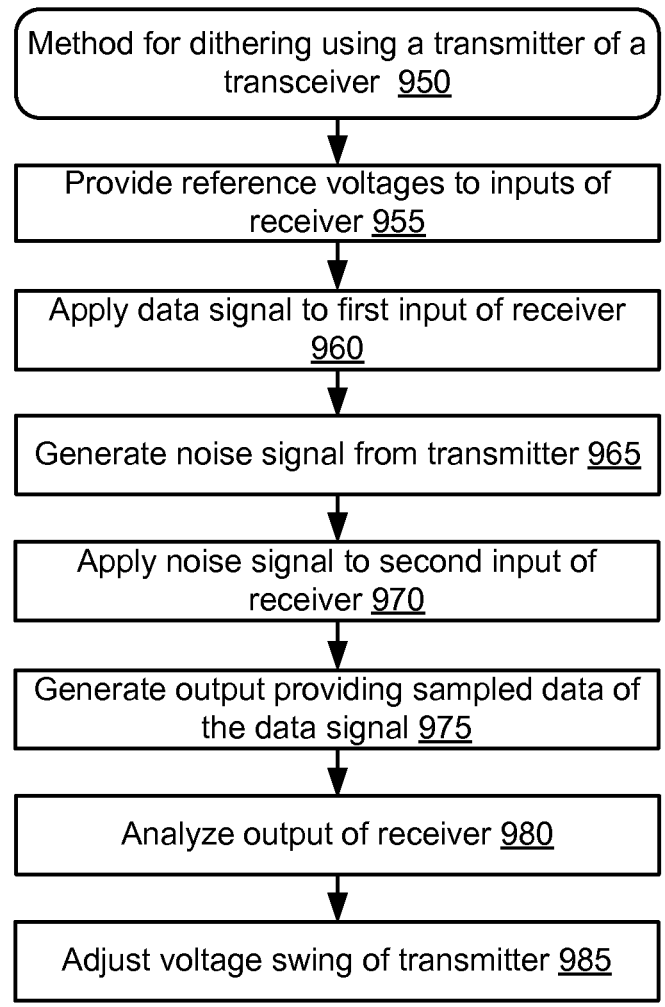
FIG. 9B is a flowchart illustrating a process for dithering by using a transmitter of a transceiver in accordance with some implementations.

FIG. 9B is a flowchart illustrating a process for dithering by using a transmitter of a transceiver in accordance with some implementations. In FIG. 9B, at block 955, reference voltages may be provided to inputs of a receiver. For example, the differential pair inputs of a receiver may receive the reference voltage to provide a DC voltage offset. At block 960, a data signal may be applied to a first input of the receiver. For example, a data signal that is to be sampled may be AC coupled with the DC reference voltage at the first input of the receiver so that the voltage at the first input of the receiver oscillates around the DC reference voltage. At block 965, a noise signal may be generated by a transmitter. For example, a transmitter (of the same transceiver including the receiver or another transceiver) may generate the noise signal using a noise source. At block 970, the noise signal may be applied to the second input of the receiver. For example, the noise signal may be AC coupled with the DC reference voltage at the second input of the receiver so that the voltage at the second input of the receiver also oscillates around the DC reference voltage. At block 975, the receiver may generate an output providing sampled data of the data signal. For example, the receiver may generate the output based on a comparison of the voltages at its first input (i.e., the data signal offset by the DC reference voltage) and its second input (i.e., the noise signal offset by the DC reference voltage).

At block 980, the output providing sampled data of the data signal may be analyzed. For example, a spectrum analyzer circuit may determine whether the output of the receiver is above a threshold for undesired harmonics (e.g., indicated by spurs, as previously discussed). At block 985, the voltage swing of the transmitter providing the noise signal may be adjusted. For example, if the output of the receiver is above the threshold, then the spectrum analyzer circuit may generate a signal indicating to the transmitter that it should increase its voltage swing. Accordingly, the harmonics may be reduced.

Figure 10:
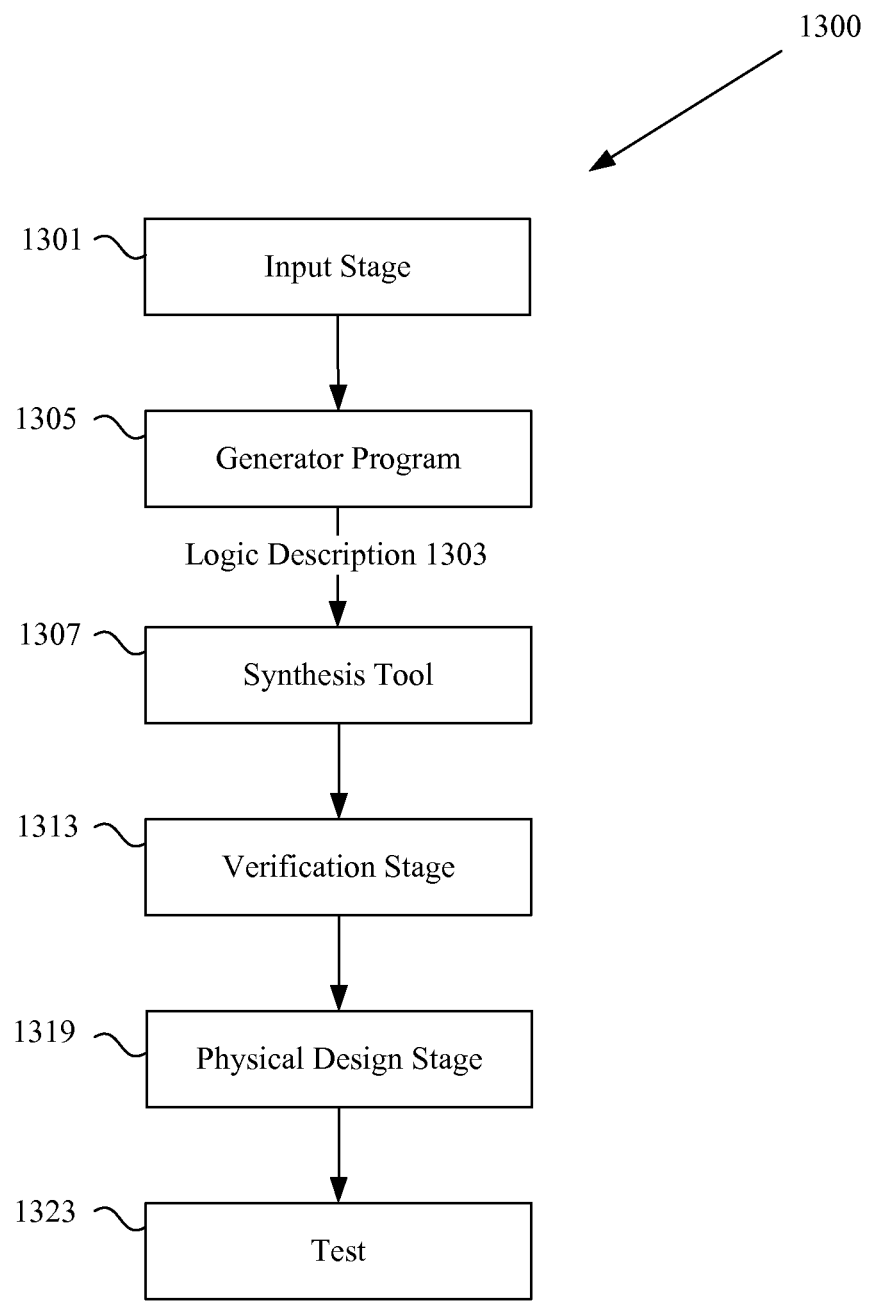
FIG. 10 illustrates a technique for implementing a programmable chip.

In some implementations, functionality disclosed herein may be implemented within a programmable chip, such as an FPGA. For example, receiver 105 and transmitter 620 in FIG. 6 may be implemented in I/O circuitry and bit generator 625 may be implemented in configurable logic of the FPGA. FIG. 10 illustrates a technique 1300 for implementing a programmable chip. An input stage 1301 receives selection information typically from a user for logic such as a processor core as well as other components to be implemented on an electronic device. In one example, the input received is in the form of a high-level language program. A generator program 1305 creates a logic description 1303 and provides the logic description 1303 along with other customized logic to any of a variety of synthesis tools, place and route programs, and logic configuration tools to allow a logic description to be implemented on an electronic device.

In one example, an input stage 1301 often allows selection and parameterization of components to be used on an electronic device. The input stage 1301 also allows configuration of hard coded logic. In some examples, components provided to an input stage include intellectual property functions, megafunctions, and intellectual property cores. The input stage 1301 may be a graphical user interface using wizards for allowing efficient or convenient entry of information. The input stage may also be a text interface or a program reading a data file such as a spreadsheet, database table, or schematic to acquire selection information. The input stage 1301 produces an output containing information about the various modules selected. At this stage, the user may enter security information about individual components that needs to be isolated. For example, different levels of component security and which components are allowed to communicate with each other may be entered.

In typical implementations, the generator program 1305 can identify the selections and generate a logic description with information for implementing the various modules. The generator program 1305 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1305 identifies pointers and provides ports for each pointer. One tool with generator program capabilities is System on a Programmable Chip (SOPC) Builder available from Altera Corporation of San Jose, Calif. The generator program 1305 also provides information to a synthesis tool 1306 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1301, generator program 1305, and synthesis tool 1306 can be separate programs. The interface between the separate programs can be a database file, a log, or simply messages transmitted between the programs. For example, instead of writing a file to storage, the input stage 1301 can send messages directly to the generator program 1305 to allow the generator program to create a logic description. Similarly, the generator program can provide information directly to the synthesis tool instead of writing HDL files. Similarly, input stage 1301, generator program 1305, and synthesis tool 1306 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1306.

A synthesis tool 1306 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1313 typically follows the synthesis stage 1306. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1313, the synthesized netlist file can be provided to physical design tools 1319 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 1323.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1301, the generator program 1305, the synthesis tool 1306, the verification tools 1313, and physical design tools 1319 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 11:
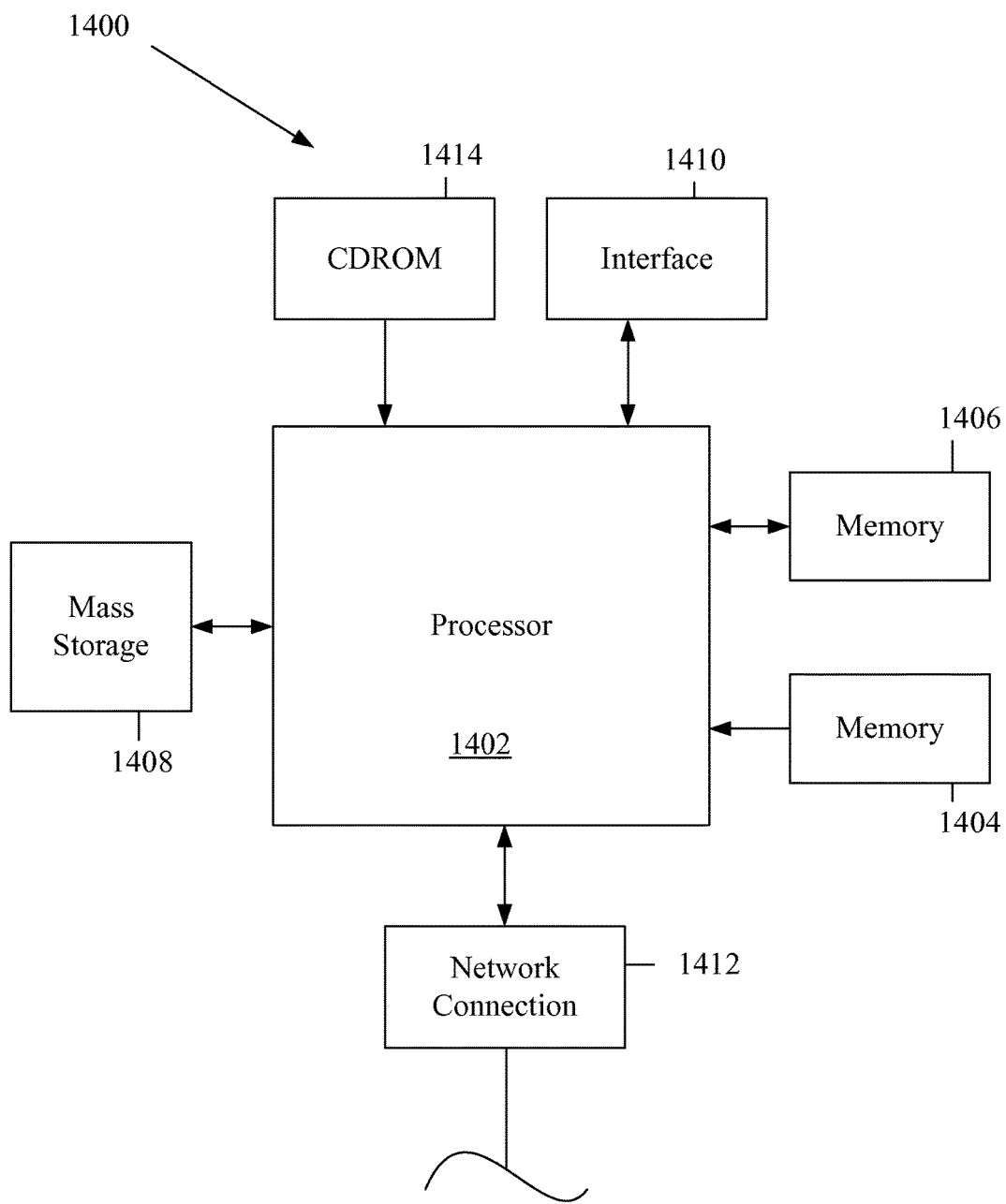
FIG. 11 illustrates one example of a computer system.

FIG. 11 illustrates one example of a computer system implementing the techniques disclosed herein. The computer system 1400 includes any number of processors 1402 (also referred to as central processing units, or CPUs) that are coupled to devices including memory 1406 (typically a random access memory, or "RAM"), memory 1404 (typically a read only memory, or "ROM"). The processors 1402 can be configured to generate an electronic design. As is well known in the art, memory 1404 acts to transfer data and instructions uni-directionally to the CPU and memory 1406 are used typically to transfer data and instructions in a bi-directional manner.

Both of these memory devices may include any suitable type of the computer-readable media described above. A mass storage device 1408 is also coupled bi-directionally to CPU 1402 and provides additional data storage capacity and may include any of the computer-readable media described above. The mass storage device 1408 may be used to store programs, data and the like and is typically a secondary storage medium such as a hard disk that is slower than memory. The mass storage device 1408 can be used to hold a library or database of prepackaged logic or intellectual property functions, as well as information on generating particular configurations. It will be appreciated that the information retained within the mass storage device 1408, may, in appropriate cases, be incorporated in standard fashion as part of memory 1406 as virtual memory. A specific mass storage device such as a CD-ROM 1414 may also pass data uni-directionally to the CPU.

CPU 1402 is also coupled to an interface 1410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1402 may be a design tool processor. Finally, CPU 1402 optionally may be coupled to a computer or telecommunications network using a network connection as shown generally at 1412. With such a network connection, it is contemplated that the CPU might receive information from the network, or might output information to the network in the course of performing the above-described process steps. It should be noted that the system 1400 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques disclosed herein.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A circuit comprising:
   a receiver having a first input, a second input, and an output, the receiver to provide sampled data of a data signal associated with the first input at its output based on a comparison of a first voltage at the first input and a second voltage at the second input, the first voltage corresponding to the data signal offset by a first reference voltage at the first input; and
   a noise source having an output coupled with the second input of the receiver, the noise source to provide a noise signal at its output, the second voltage at the second input of the receiver corresponding to the noise signal offset by to a second reference voltage.

2. The circuit of claim 1, wherein the noise source includes a transmitter.

3. The circuit of claim 2, wherein the receiver and the transmitter are components of a transceiver.

4. The circuit of claim 2, wherein the receiver and the transmitter are components of different transceivers.

5. The circuit of claim 1, wherein the data signal is alternating current (AC) coupled with the first reference voltage at the first input, and the noise signal is AC coupled with the second reference voltage at the second input.

6. The circuit of claim 1, wherein the noise source comprises:
   a bit generator to generate bits; and
   a transmitter coupled with the bit generator and to generate the noise signal based on the generated bits.

7. The circuit of claim 1, wherein the first input and the second input are differential inputs of the receiver.

8. The circuit of claim 1, wherein the noise source includes a transmitter, and the circuit further comprises:
   an analysis circuit to analyze the sampled data and adjust a voltage swing of the transmitter based on the analysis of the sampled data to increase a magnitude of the noise signal.

9. The circuit of claim 1, wherein the first reference voltage and the second reference voltage are the same voltage.

10. A method for dithering, the method comprising:
    providing a first reference voltage to a first input and a second reference voltage to a second input of a receiver;
    applying a data signal to the first reference voltage to provide a first combined voltage at the first input of the receiver;
    applying a noise signal to the second reference voltage to provide a second combined voltage at the second input of the receiver; and
    generating, by the receiver, an output signal based on a comparison of the first combined voltage and the second combined voltage.

11. The method of claim 10, further comprising:
    generating, by a transmitter, the noise signal to be applied to the second reference voltage at the second input of the receiver.

12. The method of claim 11, further comprising:
    adjusting a voltage swing of the transmitter based on an analysis of the output signal, the adjustment of the voltage swing adjusting a magnitude of the noise signal.

13. The method of claim 10, wherein the data signal and the noise signal are applied by AC coupling the data signal to the first input of the receiver and AC coupling the noise signal to the second input of the receiver.

* * * * *